United States Patent
Wei et al.

(10) Patent No.: US 12,085,600 B1
(45) Date of Patent: Sep. 10, 2024

(54) NON-INVASIVE ONLINE MONITORING CIRCUIT FOR ON-STATE SATURATION VOLTAGE OF POWER SEMICONDUCTOR

(71) Applicant: Hunan Lanhai Electrical Engineering Co., Ltd., Hunan (CN)

(72) Inventors: Xing Wei, Hunan (CN); Kehua Lyu, Hunan (CN); Yanwei Lyu, Hunan (CN)

(73) Assignee: Hunan Lanhai Electrical Engineering Co., Ltd., Hunan (CN)

( * ) Notice: Subject to any disclaimer, the term of this patent is extended or adjusted under 35 U.S.C. 154(b) by 0 days.

(21) Appl. No.: 18/656,494

(22) Filed: May 6, 2024

(30) Foreign Application Priority Data

Jun. 12, 2023 (CN) .......................... 202310690985.4

(51) Int. Cl.
  *G01R 31/26* (2020.01)
  *H03K 17/10* (2006.01)

(52) U.S. Cl.
  CPC ..... *G01R 31/2617* (2013.01); *G01R 31/2644* (2013.01); *H03K 17/102* (2013.01)

(58) Field of Classification Search
  CPC .......................... G01R 31/2617; G01R 31/2644
  See application file for complete search history.

(56) References Cited

U.S. PATENT DOCUMENTS

| | | | |
|---|---|---|---|
| 9,575,113 B2 | 2/2017 | Mankel et al. | |
| 2020/0241067 A1* | 7/2020 | Mohamed Halick | G01D 3/08 |
| 2020/0366279 A1* | 11/2020 | Ma | G01R 31/2607 |
| 2023/0132796 A1* | 5/2023 | Wang | G01R 31/2617 |
| | | | 324/762.08 |

FOREIGN PATENT DOCUMENTS

CN  110174603  *  8/2019

OTHER PUBLICATIONS

Roy I. Davis et al., "Methodology and Apparatus for Rapid Power Cycle Accumulation and In-Situ Incipient Failure Monitoring for Power Electronic Modules," 2014 IEEE 64th Electronic Components and Technology Conference (ECTC), May 2014, pp. 1996-2002.

(Continued)

*Primary Examiner* — Thang X Le
(74) *Attorney, Agent, or Firm* — JCIPRNET

(57) ABSTRACT

Disclosed is a non-invasive online monitoring circuit for an on-state saturation voltage of a power semiconductor, including one or more basic units; each basic unit includes a normally-ON switching device, a diode, and a clamping voltage supply; a gate of the normally-ON switching device is connected to a positive electrode of the clamping voltage supply; the positive electrode of the diode is connected to a source of the normally-ON switching device, and a negative electrode of the diode is connected to the gate of the normally-ON switching device; the drain of the normally-ON switching device and the negative electrode of the clamping voltage supply serve as input terminals of the monitoring circuit for accessing the power semiconductor under test; and the source of the normally-ON switching device and the negative electrode of the clamping voltage supply serve as output terminals of the monitoring circuit.

9 Claims, 6 Drawing Sheets

(56) References Cited

OTHER PUBLICATIONS

Szymon Bęczkowski et al., "Online Vce measurement method for wear-out monitoring of high power IGBT modules," 2013 15th European Conference on Power Electronics and Applications (EPE), Sep. 2013, pp. 1-7.

Serkan Dusmez et al., "An Accelerated Thermal Aging Platform to Monitor Fault Precursor On-State Resistance," 2015 IEEE International Electric Machines & Drives Conference (IEMDC), May 2015, pp. 1352-1358.

\* cited by examiner (a)

(b)

NON-INVASIVE ONLINE MONITORING CIRCUIT FOR ON-STATE SATURATION VOLTAGE OF POWER SEMICONDUCTOR

CROSS-REFERENCE TO RELATED APPLICATION

This application claims the priority benefit of China application no. 202310690985.4, filed on Jun. 12, 2023. The entirety of the above-mentioned patent application is hereby incorporated by reference herein and made a part of this specification.

BACKGROUND

Technical Field

The present disclosure belongs to the technical field of condition and health monitoring of power semiconductors, and particularly relates to a non-invasive online monitoring circuit for an on-state saturation voltage of a power semiconductor.

Description of Related Art

On-state saturation voltage is defined as a voltage across power terminals of a power semiconductor when it is in an on state, such as an on-state saturation voltage $V_{CE,sat}$ between a collector and an emitter of an insulated-gate bipolar transistor (IGBT), an on-state saturation voltage $V_{DS,sat}$ between a drain and a source of an MOSFET device, and a forward voltage $V_F$ between a positive electrode and a negative electrode of a diode. Studies have demonstrated that the on-state saturation voltage is closely related to health status of the power semiconductor. When the power semiconductor is degraded, the on-state saturation voltage thereof changes accordingly. Therefore, the on-state saturation voltage can be used to indirectly evaluate the health status of the power semiconductor. In addition, the on-state saturation voltage of the power semiconductor is linearly related to a junction temperature thereof, so the on-state saturation voltage can also be used to evaluate the junction temperature of the power semiconductor device in real time, thereby achieving thermal management and operational optimization.

However, there are considerable challenges in accurate measurement of the on-state saturation voltage of power semiconductor at present, this is because monitoring of the health status poses extremely high requirements for the on-state saturation voltage. During operation, when the power semiconductor device is in an off state, a rating voltage at power terminals thereof can reach hundreds of thousands of volts; and when the power semiconductor is in an on state, the on-state saturation voltage is only a few volts, and measurement accuracy is required to reach a millivolt level. Therefore, traditional on-state saturation voltage measurement methods can no longer meet the requirements.

For existing online on-state saturation voltage measurement solutions, in the literature [M Mankel and C Castro-Serrao, *Insulated-Gate Bipolar Transducer Collector-Emitter Saturation Voltage Measurement*, Feb. 21, 2017, U.S. Pat. No. 9,575,113], a controllable switch is employed to realize the measurement, and the controllable switch and the device under test must have functions of synchronous switching, but this method is complicated to use and requires an additional circuit to sense the switching state of the device under test. In the literature [R. I. Davis and D. J. Sprenger, *Methodology and Apparatus for Rapid Power Cycle Accumulation and In-situ Incipient Failure Monitoring for Power Electronic Modules*, in 2014 IEEE 64$^{th}$ Electronic Components and Technology Conference (ECTC). IEEE, 2014, pp. 1996-2002], a resistor is connected in series with a Zener diode to withstand high voltage. However, for a measurement circuit, high voltages cannot be withstood when a resistance value is too low, but a high resistance value will result in a large measurement error. In the literature [S. Beczkowski, P. Ghimre, A. R. de Vega, S. Munk-Nielsen, B. Rannestad, and P. Thogersen, *Online Vce Measurement Method for Wearout Monitoring of High Power IGBT Modules*, in 2013 15$^{th}$ European Conference on Power Electronics and Applications (EPE). IEEE, 2013, pp. 1-7.], a high-voltage diode is used to withstand high voltage, and a voltage supply/current source is used to ensure that the diode is conductive when the device under test is in an on state, thereby realizing the measurement of on-state saturation voltage. However, the forward voltage drop of the diode in this type of solution will introduce measurement errors and require an additional power supply. In the literature [S. Dusmez and B. Akin, *An Accelerated Thermal aging Platform to Monitor Fault Precursor On-state Resistance*, in 2015 IEEE International Electric Machines & Drives Conference (IEMDC). IEEE, 2015, pp. 1352-1358], a switch MOSFET with self-control capability connected in series with a voltage supply is configured. When a device under test is in an off state, MOSFET automatically turns off to withstand high voltages; and when the device under test is in an on state, the MOSFET automatically turns on, thereby realizing the measurement of on-state saturation voltage. However, since the on-state saturation voltage of the MOSFET is extremely low when the MOSFET is at low current, the measurement accuracy of this solution is high. Moreover, this solution requires an additional power supply, making the circuit complicated. The above solutions all involve the measurement of the on-state saturation voltage at a component level, only the on-state saturation voltage of a single power semiconductor can be measured, and only unidirectional voltage can be withstood.

SUMMARY

Objectives of the present disclosure: in order to solve the problems in the existing on-state saturation voltage measurement schemes, such as complex circuits, poor measurement accuracy, the need to introduce an additional external power supply, measurement of an on-state saturation voltage of a single power semiconductor only, and withstanding of a unidirectional voltage only, the present disclosure provides a non-invasive online monitoring circuit for an on-state saturation voltage of a power semiconductor.

Technical solution: a non-invasive online monitoring circuit for an on-state saturation voltage of a power semiconductor, including one or more basic units;
  each basic unit includes a normally-ON switching device, a diode and a clamping voltage supply;
  a gate of the normally-ON switching device is connected to a positive electrode of the clamping voltage supply;
  a positive electrode of the diode is connected to a source of the normally-ON switching device, and a negative electrode of the diode is connected to the gate of the normally-ON switching device;
  a drain of the normally-ON switching device and a negative electrode of the clamping voltage supply serve as input terminals of the monitoring circuit for accessing the power semiconductor under test, and the source of the normally-ON switching device and the negative electrode of the clamping voltage supply serve as output terminals of the monitoring circuit;

when the power semiconductor under test is in an on state, the diode in the monitoring circuit is in an off state, the normally-ON switching device is in an on state, and the output terminals of the monitoring circuit are the on-state saturation voltage of the power semiconductor under test; and when the power semiconductor under test is in an off state, the diode in the monitoring circuit is in an on state, the normally-ON switching device is in an off state, and an output voltage of the monitoring circuit is clamped at a voltage value of the clamping voltage supply.

Further, a rating voltage of the normally-ON switching device is higher than the highest rating voltage of the power semiconductor under test, and a rating voltage of the clamping voltage supply is higher than the maximum value of the on-state saturation voltage of the power semiconductor under test.

Further, the clamping voltage supply could be a Zener diode, a negative electrode of the Zener diode is connected to the gate of the normally-ON switching device, the source of the normally-ON switching device and a positive electrode of the Zener diode serve as the output terminals of the monitoring circuit, and the drain of the normally-ON switching device and the positive electrode of the Zener diode serve as input terminals of the monitoring circuit.

Further, the breakdown voltage of the Zener diode is greater than the maximum value of the on-state saturation voltage of the power semiconductor under test.

Further, two basic units are employed to implement the monitoring of the on-state saturation voltages of two power semiconductors of a half-bridge circuit, where the two basic units are marked as a first basic unit and a second basic unit;

a positive electrode of a clamping voltage supply in the first basic unit is connected to a source of a normally-ON switching device in the second basic unit;

a drain of a normally-ON switching device in the first basic unit and a drain of a normally-ON switching device in the second basic unit serve as the input terminals of the monitoring circuit for accessing s power semiconductor on an upper bridge arm of the half-bridge circuit, and the source of the normally-ON switching device in the first basic unit and the source of the normally-ON switching device in the second basic unit serve as the output terminals of the monitoring circuit for monitoring the on-state saturation voltage of the power semiconductor on the upper bridge arm of the half-bridge circuit; and a drain of the normally-ON switching device in the second basic unit and a positive electrode of the clamping voltage supply in the second basic unit serve as the input terminals of the monitoring circuit for accessing a power semiconductor on a lower bridge arm of the half-bridge circuit, and the source of the normally-ON switching device in the second basic unit and the positive electrode of the clamping voltage supply in the second basic unit serve as the output terminals of the monitoring circuit for monitoring the on-state saturation voltage of the power semiconductor on the lower bridge arm of the half-bridge circuit.

Further, two basic units are employed to implement the converter-level on-state saturation voltage monitoring for four power semiconductors in a single-phase full-bridge power converter, where the two basic units are marked as a first basic unit and a second basic unit;

input terminals of the first basic unit serve as the input terminals of the monitoring circuit, and are connected to neutral points of the two half-bridge circuits in the single-phase full-bridge power converter;

output terminals of the first basic unit are reversely connected to the input terminals of the second basic unit; and output terminals of the second basic unit serve as the output terminals of the monitoring circuit for obtaining converter-level on-state saturation voltage information, including the on-state saturation voltages of all four power semiconductors in the single-phase full-bridge power converter.

Further, four basic units are employed to implement the converter-level on-state saturation voltage monitoring for the six power semiconductors in a three-phase full-bridge power converter, where the four basic units are marked as a first basic unit, a second basic unit, a third basic unit, and a fourth basic unit;

output terminals of the first basic unit are reversely connected to input terminals of the second basic unit;

output terminals of the third basic unit are reversely connected to input terminals of the fourth basic unit;

a positive electrode of the clamping voltage supply in the first basic unit is connected to a drain of the normally-ON switching device in the first basic unit;

the drain of the normally-ON switching device in the first basic unit, the positive electrode of the clamping voltage supply in the first basic unit, and a positive electrode of the clamping voltage supply in the second basic unit serve as input terminals of the monitoring circuit, and are connected to neutral points of three-phase half-bridge circuits in the three-phase full-bridge power converter;

output terminals of the second basic unit serve as first output terminals of the monitoring circuit for acquiring information on the converter-level on-state saturation voltages of the four power semiconductors in the two-phase half-bridge circuit connected to input terminals of the first basic unit; and output terminals of the fourth basic unit serve as second output terminals of the monitoring circuit for acquiring information on the converter-level on-state saturation voltages of the four power semiconductors in the two-phase half-bridge circuit connected to input terminals of the third basic unit.

Beneficial effects: compared with the prior art, the present invention has the following advantages:

(1) by employing the monitoring circuit of the present disclosure, the online measurement of the converter-level on-state saturation voltages can be achieved;

(2) by employing the monitoring circuit of the present disclosure, non-invasive online measurement can be achieved; and (3) the monitoring circuit of the present disclosure has the advantages of small circuit size, low cost, being capable of withstanding bi-directional voltages, without the need of an external power source for power supply, plug-and-play, and the like.

DESCRIPTION OF THE EMBODIMENTS

To make the objectives, technical solutions, and advantages of the present disclosure clearer, the present disclosure will be further described in detail below in conjunction with the accompanying drawings and examples.

Embodiment 1

This embodiment discloses a non-invasive online monitoring circuit for an on-state saturation voltage of a power semiconductor, which is composed of one or more basic units to realize the monitoring of the on-state saturation voltage of the power semiconductor.

Figure 1:
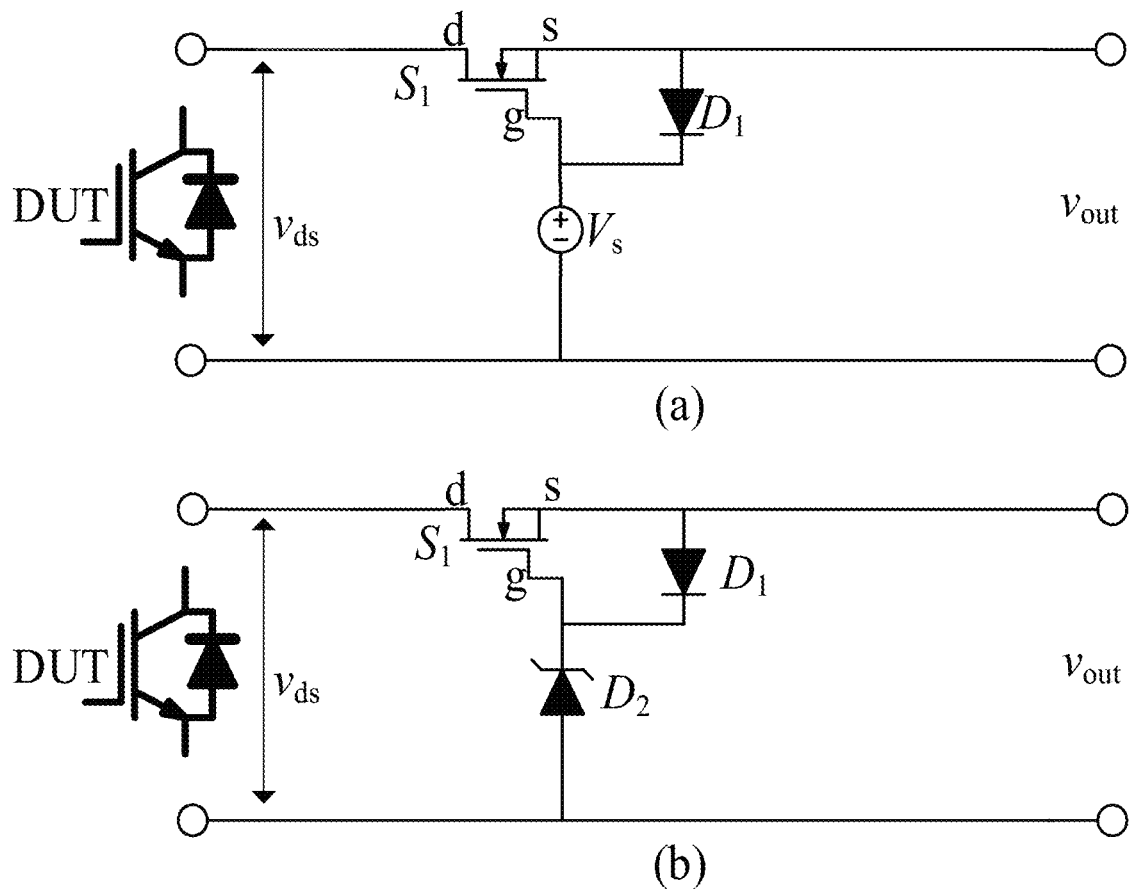
FIG. 1 is a schematic diagram of a non-invasive online monitoring circuit for the an on-state saturation voltage of a power semiconductor, where (a) of FIG. 1 is one basic unit structure of the non-invasive online monitoring circuit for an on-state saturation voltage of a power semiconductor, and (b) of FIG. 1 is another basic unit structure of the non-invasive online monitoring circuit for an on-state saturation voltage of a power semiconductor.

(a) of FIG. 1 shows a structure of one basic unit, which mainly includes: a normally-ON switching device S1, a diode D1, and a clamping voltage supply Vs; a gate of the normally-ON switching device S1 is connected to a positive electrode of the clamping voltage supply Vs, and a drain of the normally-ON switching device S1 and a negative electrode of the clamping voltage supply Vs serve as input terminals of the monitoring circuit for accessing a power semiconductor under test (DUT in FIG. 1); and a positive electrode of the diode D1 is connected to a source of the normally-ON switching device S1, a negative electrode of the diode D1 is connected to the gate of the normally-ON switching device S1, and the source of the normally-ON switching device S1 and the negative electrode of the clamping voltage supply Vs serve as output terminals of the monitoring circuit.

The normally-ON switching device S1 in this embodiment includes but is not limited to an N-channel depletion-mode MOSFET. For the N-channel depletion-mode MOSFET, when the power semiconductor under test is in an on state, a gate-source voltage of the N-channel depletion-mode MOSFET is greater than zero, when the power semiconductor under test is in an off state, the gate-source voltage of the N-channel depletion-mode MOSFET is a negative value; and a rating voltage of the normally-ON switching device S1 needs to be higher than the highest rating voltage of the power semiconductor under test (DUT in FIG. 1), and a voltage level the clamping voltage supply Vs needs to be higher than the maximum value of the on-state saturation voltage of the power semiconductor under test (DUT in FIG. 1).

When the power semiconductor under test (DUT in FIG. 1) is in the on state, the voltage across connected terminals thereof is the on-state saturation voltage thereof. Since the maximum value of the on-state saturation voltage is lower than the clamping voltage supply Vs, in which case, the diode D1 is in an off state, no current flows through the normally-ON switching device S1, and a voltage vgs between the gate and the source of the normally-ON switching device is zero; the normally-ON switching device S1 is in an on state, in which case, the output voltage of the monitoring circuit is the on-state saturation voltage of the power semiconductor under test (DUT in FIG. 1).

When the power semiconductor under test (DUT in FIG. 1) is in the off state, the voltage across connected terminals thereof rises to the high-voltage DC bus voltages; and when this voltage is higher than the voltage of the clamping voltage supply Vs, the diode D1 is turned on, in which case, a negative voltage is formed between the gate and the source of the normally-ON switching device S1, resulting in the normally-ON switching device S1 being turned off and being in a high resistance state, in which case, high-voltage bus voltages at both terminals of the power semiconductor under test (DUT in FIG. 1) are incapable of passing through the normally-ON switching device S1, in which case, the output voltage of the monitoring circuit is clamped at a voltage value of the clamping voltage supply Vs.

Embodiment 2

Embodiment 2 shows a basic unit of another structure on the basis of Embodiment 1, referring to (b) of FIG. 1. Both (a) of FIG. 1 and (b) of FIG. 1 can implement the monitoring of on-state saturation voltage of the power semiconductor under test (DUT in FIG. 1). The structure shown in (b) of FIG. 1 is obtained by replacing the clamping voltage supply Vs in (a) of FIG. 1 with a Zener diode D2, that is, the gate of the normally-ON switching device S1 is connected to a negative electrode of the Zener diode D2, the drain of the normally-ON switching device S1 and a positive electrode of the Zener diode D2 serve as input terminals of the monitoring circuit for accessing the power semiconductor under test (DUT in FIG. 1); and the positive electrode of the diode D1 is connected to the source of the normally-ON switching device S1, the negative electrode of the diode D1 is connected to the gate of the normally-ON switching device S1, and the source of the normally-ON switching device S1 and the positive electrode of the Zener diode D2 serve as the output terminals of the monitoring circuit. For the basic unit shown in FIG. 1 (*b*), the rating voltage of the Zener diode D2 needs to be greater than the maximum value of the on-state saturation voltage of the power semiconductor under test (DUT in FIG. 1), and the rating voltage of the normally-ON switching device S1 needs to be higher than the highest rating voltage of the power semiconductor under test (DUT in FIG. 1).

The basic unit structure shown in this embodiment can implement all functions of the basic unit structure disclosed in Embodiment 1, and further, the basic unit structure disclosed in this embodiment does not need to be externally connected to a power supply.

Embodiment 3

In this embodiment, the non-invasive online monitoring circuit for an on-state saturation voltage of a power semiconductor disclosed in Embodiment 1 or 2 is applied to a half-bridge circuit in a power converter for monitoring on-state saturation voltages of two power semiconductors of the half-bridge circuit. A specific structure can refer to FIG. 2, which mainly includes a half-bridge circuit composed of 4 power semiconductors (marked as $T_1$, $T_2$, $T_3$, $T_4$ in FIG. 2), a first basic unit, and a second basic unit. The on-state saturation voltages of power semiconductors on upper and lower bridge arms of the half-bridge circuit can be monitored through the first basic unit and the second basic unit, respectively. In this embodiment, the first basic unit and the second basic unit are the basic unit structures disclosed in Embodiment 1 or 2.

Figure 2:
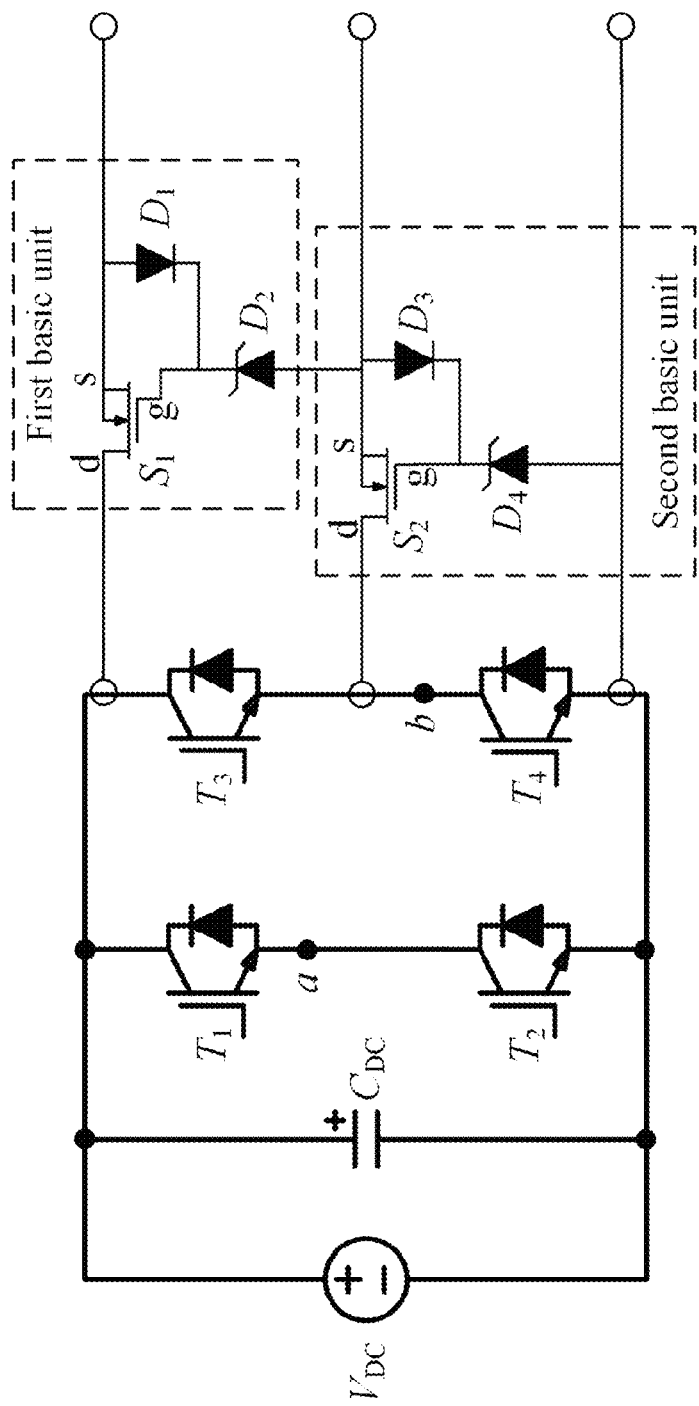
FIG. 2 is a schematic diagram for monitoring an on-state saturation voltage of two power semiconductors on a half-bridge circuit in a power converter.

Taking the basic unit structure in Embodiment 2 as an example, as shown in FIG. 2, a connection relationship between the first basic unit and the second basic unit is: the positive electrode of the Zener diode D2 in the first basic unit is connected to the source of the normally-ON switching device in the second basic unit; the drain of the normally-ON switching device in the first basic unit and the drain of the normally-ON switching device in the second basic unit serve as the input terminals of the monitoring circuit for accessing the power semiconductor on the upper bridge arm of the half-bridge circuit, the source of the normally-ON switching device in the first basic unit and the source of the normally-ON switching device in the second basic unit serve as the output terminals of the monitoring circuit for monitoring the on-state saturation voltage of the power semiconductor on the upper bridge arm of the half-bridge circuit; and the drain of the normally-ON switching device in the second basic unit and the positive electrode of the Zener diode D4 in the second basic unit serve as the input terminals of the monitoring circuit for accessing the power semiconductor on the lower bridge arm of the half-bridge circuit, and the source of the normally-ON switching device in the second basic unit and the positive electrode of the Zener diode D4 in the second basic unit serve as the output terminals of the monitoring circuit for monitoring the on-state saturation voltage of the power semiconductor on the lower bridge arm of the half-bridge circuit.

In the above structure, monitoring of the on-state saturation voltage can also be implemented using the basic unit structure disclosed in Embodiment 1.

Embodiment 4

In this embodiment, the non-invasive online monitoring circuit for an on-state saturation voltage of a power semiconductor disclosed in Embodiment 1 or 2 is applied to the monitoring of on-state saturation voltages of all power semiconductors in a single-phase power converter, to achieve the converter-level monitoring.

Figure 3:
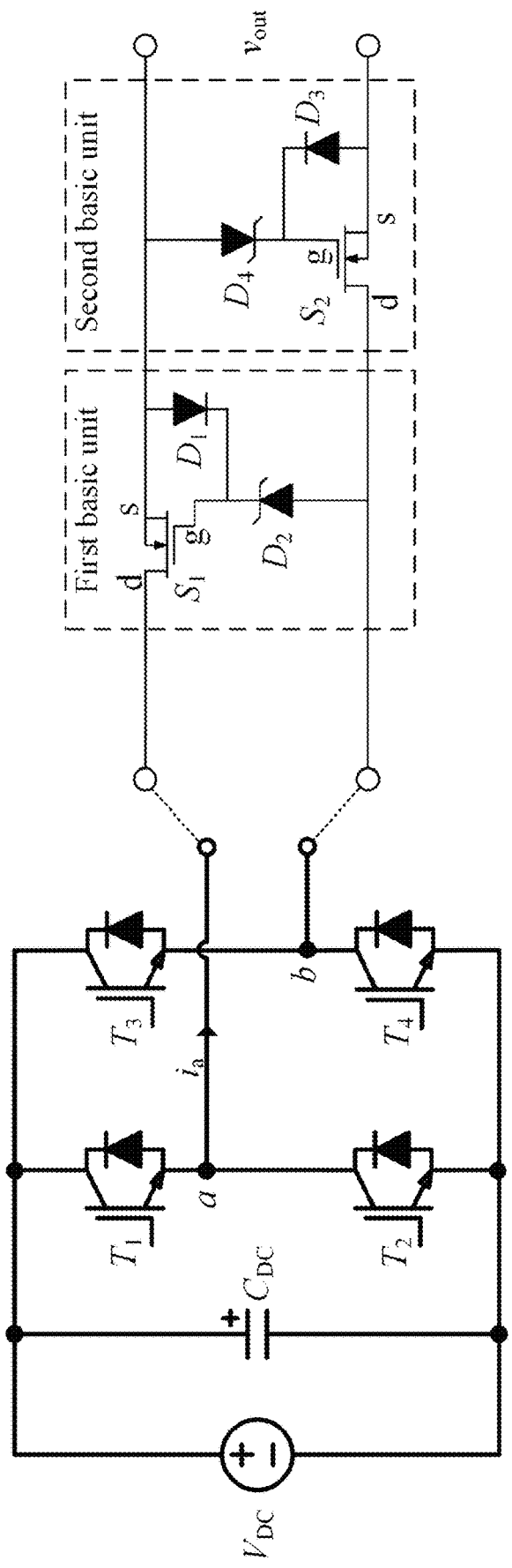
FIG. 3 is a schematic diagram for monitoring an on-state saturation voltage of all power semiconductors in a single-phase power converter.
Figure 4:
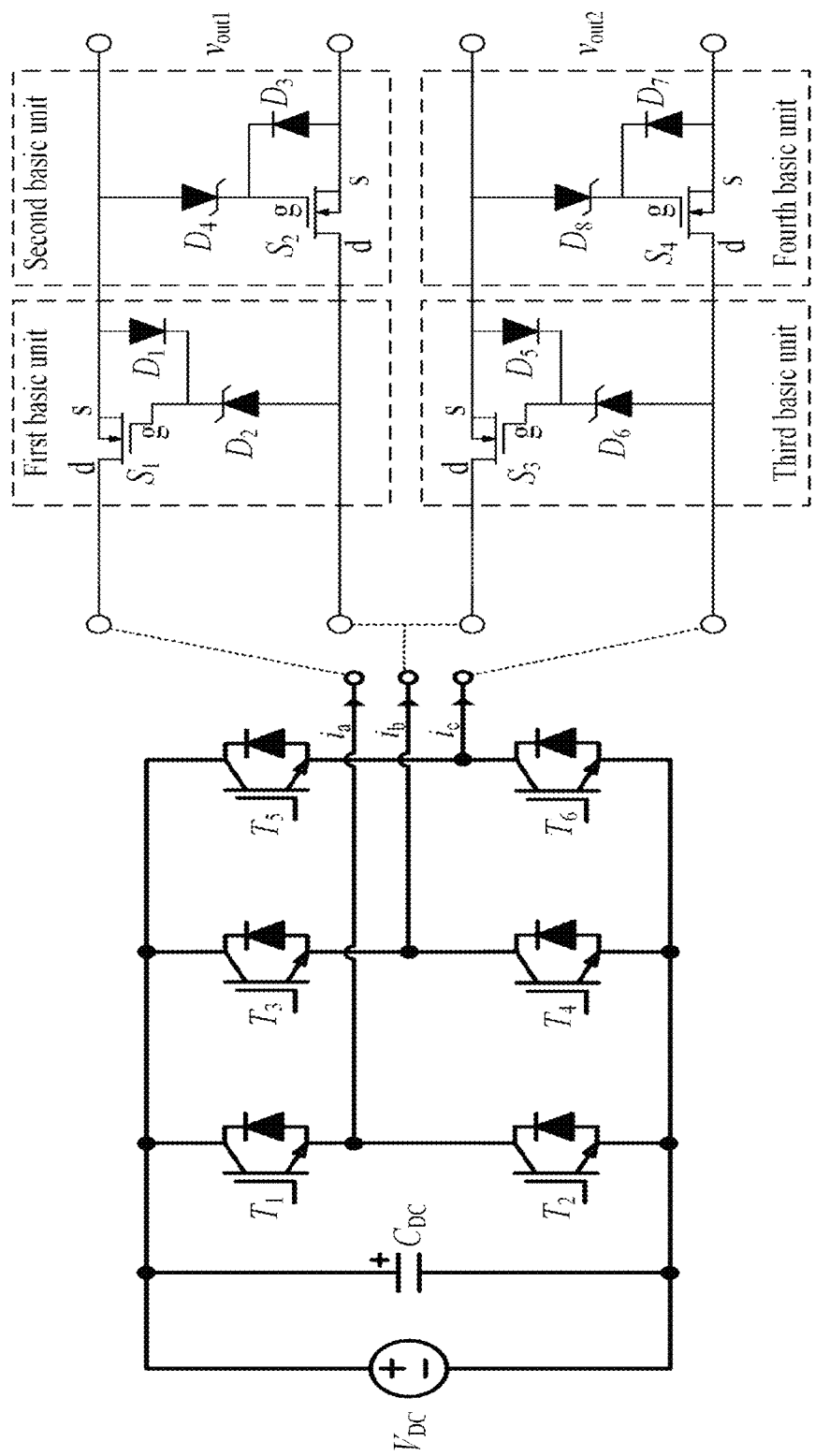
FIG. 4 is a schematic diagram for monitoring an on-state saturation voltages of all power semiconductors in a three-phase power converter.

Taking the basic unit structure of Embodiment 2 as an example, a specific structure can refer to FIG. 3, including a first basic unit and a second basic unit. The input terminals of the first basic unit serve as the input terminals of the monitoring circuit, and are connected to neutral points of the single-phase full-bridge power converter; and the output terminals of the first basic unit are reversely connected to the input terminals of the second basic unit, the drain of the normally-ON switching device S2 in the second basic unit is connected to the positive electrode of the Zener diode D2 in the first basic unit, the positive electrode of the Zener diode D4 in the second basic unit is connected to the source of the normally-ON switching device S1 in the first basic unit, and the positive electrode of the Zener diode D2 and the source of the normally-ON switching device S2 in the second basic unit constitute output terminals of this embodiment for obtaining information on the converter-level on-state saturation voltage, including the on-state saturation voltage of all four power semiconductors in the single-phase full-bridge power converter.

The working principle is that when the output voltage $v_{ab}$ of the single-phase power converter is a positive bus voltage, the normally-ON switching device S1 in the first basic unit is turned off, and the output voltage Vout of the monitoring circuit is clamped at the breakdown voltage of the Zener diode D2 in the first basic unit. When the output voltage $v_{ab}$ of the single-phase power converter is a negative bus voltage, the normally-ON switching device S2 of the second basic unit is turned off, and the output voltage Vout of the monitoring circuit is clamped at the breakdown voltage of the Zener diode D4 in the second basic unit. When the output voltage $v_{ab}$ of the single-phase power converter is a positive and negative on-state saturation voltage, the diode D1 in the first basic unit and the diode D3 in the second basic unit are respectively turned off, the normally-ON switching device S1 in the first basic unit and the normally-ON switching device S2 in the second basic unit are respectively in an on state, and the output voltage vout of the monitoring circuit is the output voltage $v_{ab}$ of the single-phase power converter.

In the above structure, the converter-level monitoring can also be implemented using the basic unit structure disclosed in Embodiment 1.

Embodiment 5

In this embodiment, the non-invasive online monitoring circuit for an on-state saturation voltage of a power semiconductor disclosed in Embodiment 1 or 2 is applied to the monitoring of on-state saturation voltages of all power semiconductors in a three-phase full-bridge power converter, to achieve the converter-level monitoring.

Taking the basic unit structure of Embodiment 2 as an example, in this embodiment, four basic units are employed to implement the monitoring of converter-level on-state saturation voltage of all six power semiconductors in a three-phase full-bridge power converter, where the four basic units are marked as a first basic unit, a second basic unit, a third basic unit and a fourth basic unit; the output terminals of the first basic unit is reversely connected to the input terminals of the second basic unit; the output terminal of the third basic unit is reversely connected to the input terminal of the fourth basic unit; the positive electrode of the Zener diode D2 in the first basic unit is connected to the drain of the normally-ON switching device in the first basic unit; the drain of the normally-ON switching device in the first basic unit, the positive electrode of the Zener diode D2 in the first basic unit and the positive electrode of the Zener diode D4 in the second basic unit serve as the input terminals of the monitoring circuit, and are connected to the neutral points of the three-phase full-bridge power converter; the output terminals of the second basic unit serves as the first output terminals of the monitoring circuit for acquiring information on converter-level on-state saturation voltages of four power semiconductors in the two-phase half-bridge circuit connected to the input terminals of the first basic unit; and the output terminals of the fourth basic unit serve as the second output terminal of the monitoring circuit for acquiring information on converter-level on-state saturation voltages of the four power semiconductors in the two-phase half-bridge circuit connected to the input terminals of the third basic unit.

The working principle of this embodiment is similar to that of Embodiment 4 and will not be described in detail herein.

In the above structure, the converter-level monitoring can also be implemented using the basic unit structure disclosed in Embodiment 1.

Figure 5:
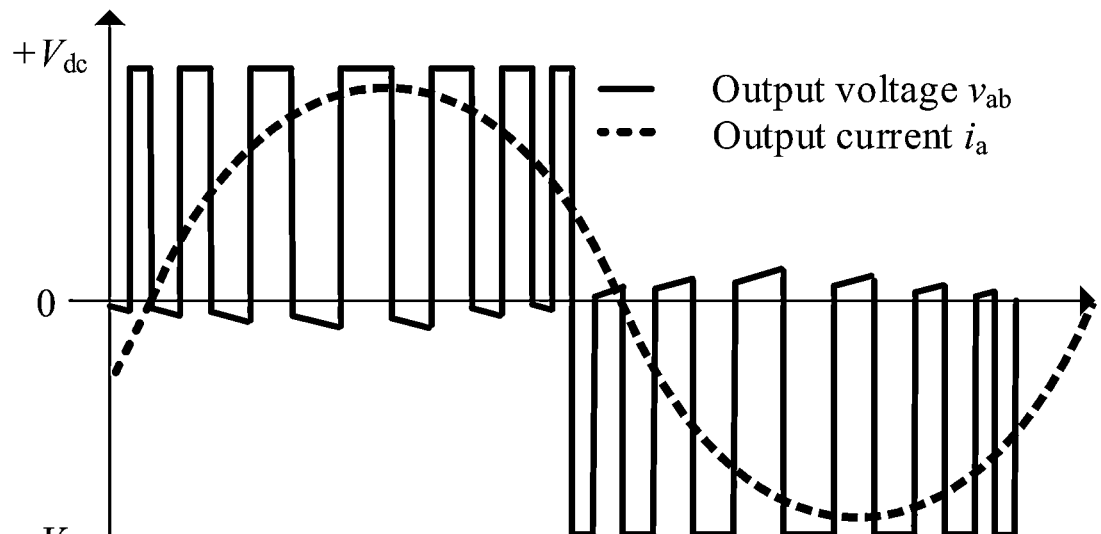
FIG. 5 is a theoretical output waveform of a single-phase power converter and a theoretical output waveform of a monitoring circuit of the present disclosure, where (a) of FIG. 5 is the theoretical output waveform of the single-phase power converter, and (b) of FIG. 5 is the theoretical output waveform of the monitoring circuit of the present disclosure.
Figure 5:
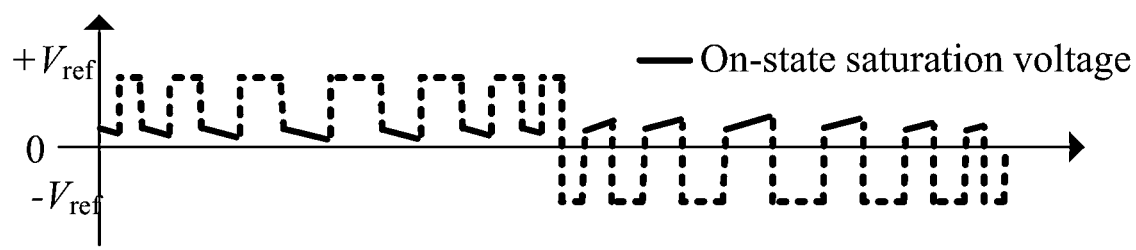

A single-phase power converter is now employed as an example to illustrate the implementation process and experimental verification results of the present disclosure. A specific schematic diagram is shown in FIG. 3. A theoretical output waveform of the single-phase power converter is shown in (a) of FIG. 5, where the output voltages $v_{ab}$ of the single-phase power converter includes positive and negative bus voltages, as well as positive and negative on-state saturation voltages; and the theoretical output waveform of the circuit of the present disclosure is shown in (b) of FIG. 5, in which case, positive and negative bus voltages±$V_{dc}$ are respectively clamped at breakdown voltages±$V_{ref}$ of positive and negative Zener diodes, and the positive and negative on-state saturation voltages are completely retained, so that accurate measurement of on-state saturation voltages are implemented.

Figure 6:
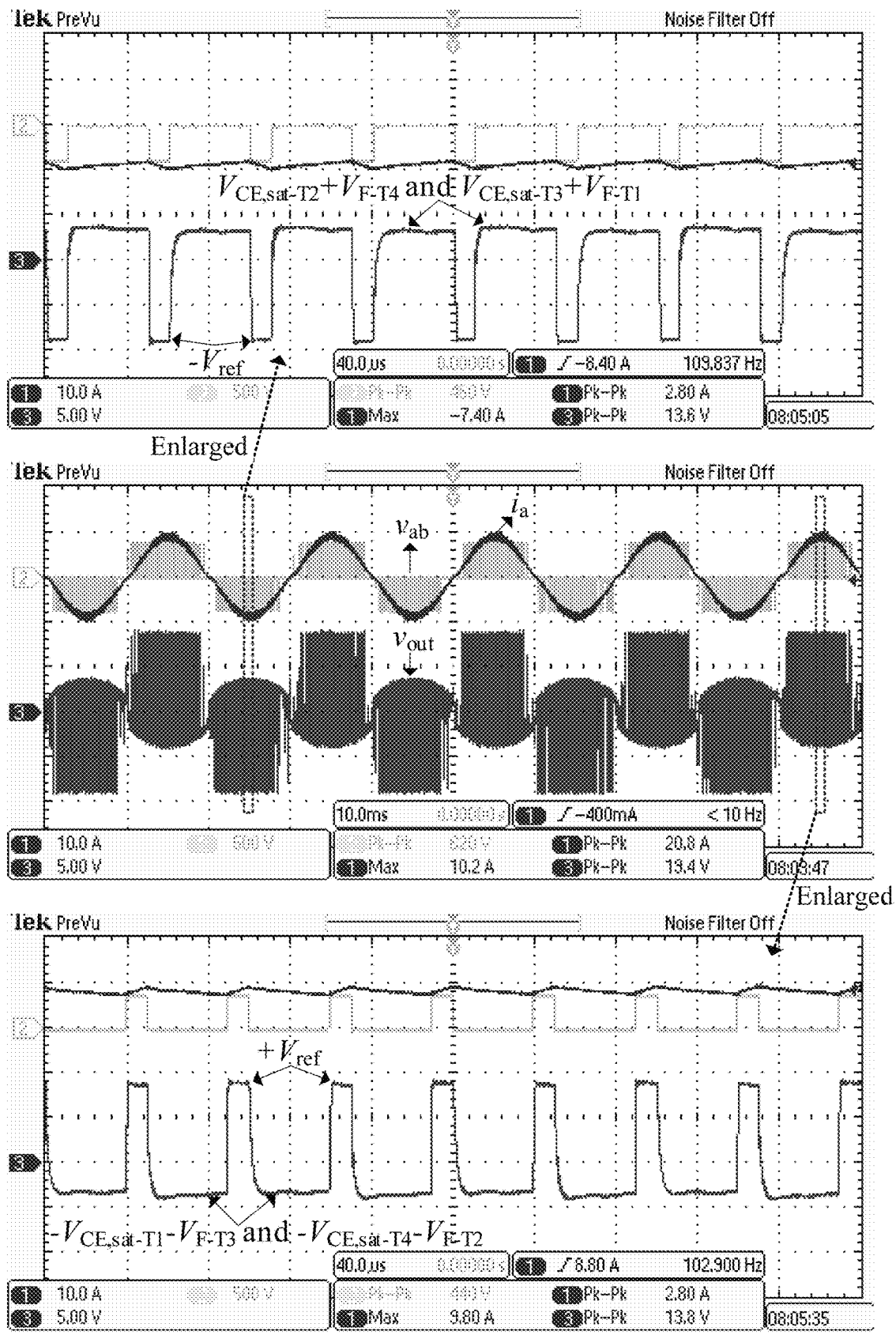
FIG. 6 shows experiment waveforms from actual measurements.

FIG. 6 shows experiment waveforms from actual measurement, in which case, the power semiconductors $T_1$-$T_4$ in the single-phase power converter in FIG. 3 are composed of an insulated-gate bipolar transistor (IGBT) and a freewheeling diode in anti-parallel connection thereto. It can be seen that the positive and negative bus voltages±$V_{dc}$ of the output voltages $v_{ab}$ of the single-phase power converter are respectively successfully clamped at breakdown voltages±$V_{ref}$ of a selected Zener diode, and the on-state saturation voltages of the power semiconductors are completely reserved, where $V_{CE,sat-T1}$, $V_{CE,sat-T2}$, $V_{CE,sat-T3}$, and $V_{CE,sat-T4}$ are saturation on-state saturation voltages of the IGBT in the power semiconductors $T_1$-$T_4$, respectively, and $V_{F-T1}$, $V_{F-T2}$, $V_{F-T3}$ and $V_{F-T4}$ are forward on-state saturation voltages of freewheeling diodes in anti-parallel connection in the power semiconductors $T_1$-$T_4$, respectively.

Those skilled in the art can easily understand that the above are only preferred embodiments of the present disclosure, and are not intended to limit the present disclosure. Any modifications, equivalent replacements and improvements made within the spirit and principles of the present disclosure, etc., should be included within the protection scope of the present disclosure.

What is claimed is:

1. A non-invasive online monitoring circuit for an on-state saturation voltage of a power semiconductor, comprising one or more basic units, wherein
   each of the basic units comprise a normally-ON switching device, a diode and a clamping voltage supply;
   a gate of the normally-ON switching device is connected to a positive electrode of the clamping voltage supply;
   a positive electrode of the diode is connected to a source of the normally-ON switching device, and a negative electrode of the diode is connected to the gate of the normally-ON switching device;
   a drain of the normally-ON switching device and a negative electrode of the clamping voltage supply serve as input terminals of the non-invasive online monitoring circuit for accessing a power semiconductor under test; and the source of the normally-ON switching device and the negative electrode of the clamping voltage supply serve as output terminals of the non-invasive online monitoring circuit;
   when the power semiconductor under test in an on state, the diode is in an off state, the normally-ON switching device is in an on state, and the output terminals of the non-invasive online monitoring circuit are the on-state saturation voltage of the power semiconductor under test;
   when the power semiconductor under test in an off state, the diode is in an on state, the normally-ON switching device is in an off state, and an output voltage of the non-invasive online monitoring circuit is clamped at a voltage value of the clamping voltage supply;
   a rating voltage of the normally-ON switching device is higher than the highest rating voltage of the power semiconductor under test, and the voltage value of the clamping voltage supply is higher than the maximum value of the on-state saturation voltage of the power semiconductor under test;
   two basic units are employed to implement a converter-level on-state saturation voltage monitoring for four power semiconductors in a single-phase full-bridge power converter, and the two basic units are marked as a first basic unit and a second basic unit;
   input terminals of the first basic unit serve as input terminals of the non-invasive online monitoring circuit, and are connected to neutral points of two half-bridge circuits in the single-phase full-bridge power converter;
   output terminals of the first basic unit are reversely connected to input terminals of the second basic unit; and
   output terminals of the second basic unit serve as output terminals of the non-invasive online monitoring circuit for obtaining converter-level on-state saturation voltage information that comprises on-state saturation voltages of all four power semiconductors in the single-phase full-bridge power converter.

2. The non-invasive online monitoring circuit for the on-state saturation voltage of the power semiconductor according to claim 1, wherein the clamping voltage supply is a Zener diode, a negative electrode of the Zener diode is connected to the gate of the normally-ON switching device, the source of the normally-ON switching device and a positive electrode of the Zener diode serve as the output terminals of the non-invasive online monitoring circuit, and the drain of the normally-ON switching device and the positive electrode of the Zener diode serve as the input terminals of the non-invasive online monitoring circuit.

3. The non-invasive online monitoring circuit for the on-state saturation voltage of the power semiconductor according to claim 2, wherein a breakdown voltage of the Zener diode is greater than the maximum value of the on-state saturation voltage of the power semiconductor under test.

4. A non-invasive online monitoring circuit for an on-state saturation voltage of a power semiconductor, consisting of two basic units, wherein each of the two basic units comprises a normally-ON switching device, a diode and a clamping voltage supply;
   a gate of the normally-ON switching device is connected to a positive electrode of the clamping voltage supply;
   a positive electrode of the diode is connected to a source of the normally-ON switching device, and a negative electrode of the diode is connected to the gate of the normally-ON switching device;
   a drain of the normally-ON switching device and a negative electrode of the clamping voltage supply serve as input terminals of the non-invasive online monitoring circuit for accessing a power semiconductor under test; and the source of the normally-ON switching device and the negative electrode of the clamping voltage supply serve as output terminals of the non-invasive online monitoring circuit;

when the power semiconductor under test in an on state, the diode is in an off state, the normally-ON switching device is in an on state, and the output terminals of the non-invasive online monitoring circuit are the on-state saturation voltage of the power semiconductor under test;

when the power semiconductor under test in an off state, the diode is in an on state, the normally-ON switching device is in an off state, and an output voltage of the non-invasive online monitoring circuit is clamped at a voltage value of the clamping voltage supply;

a rating voltage of the normally-ON switching device is higher than the highest rating voltage of the power semiconductor under test, and the voltage value of the clamping voltage supply is higher than the maximum value of the on-state saturation voltage of the power semiconductor under test;

the two basic units are employed to implement a monitoring of the on-state saturation voltages of two power semiconductors of a half-bridge circuit, and the two basic units are marked as a first basic unit and a second basic unit;

a positive electrode of a clamping voltage supply in the first basic unit is connected to a source of a normally-ON switching device in the second basic unit;

a drain of a normally-ON switching device in the first basic unit and a drain of the normally-ON switching device in the second basic unit serve as the input terminals of the non-invasive online monitoring circuit for accessing a power semiconductor on an upper bridge arm of the half-bridge circuit, and a source of the normally-ON switching device in the first basic unit and a source of the normally-ON switching device in the second basic unit serve as the output terminals of the non-invasive online monitoring circuit for monitoring the on-state saturation voltage of the power semiconductor on the upper bridge arm of the half-bridge circuit of the half-bridge circuit; and the drain of the normally-ON switching device in the second basic unit and a positive electrode of a clamping voltage supply of the second basic unit serve as input terminals of the non-invasive online monitoring circuit for accessing a power semiconductor on a lower bridge arm of the half-bridge circuit, and the source of the normally-ON switching device in the second basic unit and a positive electrode of the clamping voltage supply of the second basic unit serve as the output terminals of the non-invasive online monitoring circuit for monitoring the on-state saturation voltage of the power semiconductor on the lower bridge arm of the half-bridge circuit.

5. The non-invasive online monitoring circuit for the on-state saturation voltage of the power semiconductor according to claim 4, wherein the clamping voltage supply is a Zener diode, a negative electrode of the Zener diode is connected to the gate of the normally-ON switching device, the source of the normally-ON switching device and a positive electrode of the Zener diode serve as the output terminals of the non-invasive online monitoring circuit, and the drain of the normally-ON switching device and the positive electrode of the Zener diode serve as the input terminals of the non-invasive online monitoring circuit.

6. The non-invasive online monitoring circuit for the on-state saturation voltage of the power semiconductor according to claim 5, wherein a breakdown voltage of the Zener diode is greater than the maximum value of the on-state saturation voltage of the power semiconductor under test.

7. A non-invasive online monitoring circuit for an on-state saturation voltage of a power semiconductor, consisting of four basic units, wherein each of the four basic units comprises a normally-ON switching device, a diode and a clamping voltage supply;

a gate of the normally-ON switching device is connected to a positive electrode of the clamping voltage supply;

a positive electrode of the diode is connected to a source of the normally-ON switching device, and a negative electrode of the diode is connected to the gate of the normally-ON switching device;

a drain of the normally-ON switching device and a negative electrode of the clamping voltage supply serve as input terminals of the non-invasive online monitoring circuit for accessing a power semiconductor under test; and the source of the normally-ON switching device and the negative electrode of the clamping voltage supply serve as output terminals of the non-invasive online monitoring circuit;

when the power semiconductor under test in an on state, the diode is in an off state, the normally-ON switching device is in an on state, and the output terminals of the non-invasive online monitoring circuit are the on-state saturation voltage of the power semiconductor under test;

when the power semiconductor under test in an off state, the diode is in an on state, the normally-ON switching device is in an off state, and an output voltage of the non-invasive online monitoring circuit is clamped at a voltage value of the clamping voltage supply;

a rating voltage of the normally-ON switching device is higher than the highest rating voltage of the power semiconductor under test, and the voltage value of the clamping voltage supply is higher than the maximum value of the on-state saturation voltage of the power semiconductor under test;

the four basic units are employed to implement a converter-level on-state saturation voltage monitoring for six power semiconductors in a three-phase full-bridge power converter, and the four basic units are marked as a first basic unit, a second basic unit, a third basic unit, and a fourth basic unit;

output terminals of the first basic unit are reversely connected to input terminals of the second basic unit;

output terminals of the third basic unit are reversely connected to input terminals of the fourth basic unit;

a positive electrode of the clamping voltage supply in the first basic unit is connected to a drain of the normally-ON switching device in the first basic unit;

the drain of the normally-ON switching device in the first basic unit, the positive electrode of the clamping voltage supply in the first basic unit, and a positive electrode of the clamping voltage supply in the second basic unit serve as the input terminals of the non-invasive online monitoring circuit, and are connected to neutral points of three-phase half-bridge circuits in the three-phase full-bridge power converter;

output terminals of the second basic unit serve as first output terminals of the non-invasive online monitoring circuit for acquiring information on the converter-level on-state saturation voltages of four power semiconductors in two-phase half-bridge circuit connected to input terminals of the first basic unit; and output terminals of the fourth basic unit serve as second output terminals of the non-invasive online monitoring circuit for acquiring information on the converter-level on-state saturation voltages of the four power semiconductors in the two-phase half-bridge circuit connected to input terminals of the third basic unit.

8. The non-invasive online monitoring circuit for the on-state saturation voltage of the power semiconductor according to claim 7, wherein the clamping voltage supply is a Zener diode, a negative electrode of the Zener diode is connected to the gate of the normally-ON switching device, the source of the normally-ON switching device and a positive electrode of the Zener diode serve as the output terminals of the non-invasive online monitoring circuit, and the drain of the normally-ON switching device and the positive electrode of the Zener diode serve as the input terminals of the non-invasive online monitoring circuit.

9. The non-invasive online monitoring circuit for the on-state saturation voltage of the power semiconductor according to claim 8, wherein a breakdown voltage of the Zener diode is greater than the maximum value of the on-state saturation voltage of the power semiconductor under test.

\* \* \* \* \*